(12) United States Patent
Tsuda et al.

(10) Patent No.: US 11,631,659 B2
(45) Date of Patent: Apr. 18, 2023

(54) HIGH-FREQUENCY MODULE AND COMMUNICATION APPARATUS

(71) Applicant: Murata Manufacturing Co., Ltd., Kyoto (JP)

(72) Inventors: Motoji Tsuda, Kyoto (JP); Takanori Uejima, Kyoto (JP); Yuji Takematsu, Kyoto (JP); Katsunari Nakazawa, Kyoto (JP); Masahide Takebe, Kyoto (JP); Shou Matsumoto, Kyoto (JP); Naoya Matsumoto, Kyoto (JP); Yutaka Sasaki, Kyoto (JP); Yuuki Fukuda, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 548 days.

(21) Appl. No.: 16/780,087

(22) Filed: Feb. 3, 2020

(65) Prior Publication Data
US 2020/0251459 A1  Aug. 6, 2020

(30) Foreign Application Priority Data

Feb. 4, 2019 (JP) .............................. JP2019-018181

(51) Int. Cl.
*H01L 25/16* (2023.01)
*H01L 23/00* (2006.01)
(Continued)

(52) U.S. Cl.
CPC ........ *H01L 25/165* (2013.01); *H01L 23/3128* (2013.01); *H01L 23/49827* (2013.01);
(Continued)

(58) Field of Classification Search
CPC ............... H01L 23/66; H01L 23/49827; H01L 23/5384; H01L 23/49811; H01L 23/5389;
(Continued)

(56) References Cited

U.S. PATENT DOCUMENTS 5,285,352 A * 2/1994 Pastore ............... H01L 23/3677
257/E23.101
5,923,084 A * 7/1999 Inoue ................... H01L 23/3121
257/E23.125
(Continued)

FOREIGN PATENT DOCUMENTS

CN          1770649 A      5/2006
JP      2000-332171 A     11/2000
(Continued)

OTHER PUBLICATIONS

Office Action for CN Application No. 202010079663.2 dated Nov. 23, 2020.

*Primary Examiner* — Victor A Mandala
*Assistant Examiner* — Lawrence C Tynes, Jr.
(74) *Attorney, Agent, or Firm* — Pearne & Gordon LLP

(57) ABSTRACT

A high-frequency module includes a mounting substrate having main surfaces 30a and 30b, a first circuit component mounted on the main surface 30a, a second circuit component mounted on the main surface 30b, an external connection terminal arranged on the main surface 30b side relative to the main surface 30a with respect to the mounting substrate, a long via conductor connected to the first circuit component, passing through the mounting substrate, and having a substantially long shape when the mounting substrate is viewed in a plan view, and a metal block arranged on the main surface 30b side relative to the main surface 30a with respect to the mounting substrate and connecting the long via conductor and the external connection terminal. When the mounting substrate is viewed in a plan view, the first circuit component overlaps the long via conductor and the metal block overlaps the long via conductor.

19 Claims, 10 Drawing Sheets

(51) Int. Cl.
| | |
|---|---|
| *H01L 23/31* | (2006.01) |
| *H01L 23/552* | (2006.01) |
| *H01L 23/498* | (2006.01) |
| *H01L 23/66* | (2006.01) |
| *H01Q 1/24* | (2006.01) |
| *H01Q 1/02* | (2006.01) |

(52) U.S. Cl.
CPC ............ *H01L 23/552* (2013.01); *H01L 23/66* (2013.01); *H01L 24/16* (2013.01); *H01L 24/17* (2013.01); *H01Q 1/02* (2013.01); *H01Q 1/243* (2013.01); *H01L 2223/6655* (2013.01); *H01L 2224/16235* (2013.01); *H01L 2224/1703* (2013.01)

(58) Field of Classification Search
CPC ......... H01L 23/3128; H01L 2223/6677; H01L 2224/08165; H01L 2224/16165; H01L 2224/16235; H01L 2224/32165; H01L 2224/32235; H01L 2224/40165; H01L 2224/40235; H01L 2224/48165; H01L 2224/48235; H01L 2224/1703; H01L 2224/16227; H01L 2224/17051; H01L 2225/06548; H01L 25/105; H01L 25/16; H01L 25/18; H01L 24/17; H01L 24/16; H01L 2924/15311; H01L 2924/15313; H01Q 1/243
See application file for complete search history.

(56) References Cited

U.S. PATENT DOCUMENTS

| | | | | |
|---|---|---|---|---|
| 6,156,980 | A * | 12/2000 | Peugh ................. | H01L 23/3677 174/262 |
| 7,303,947 | B1 * | 12/2007 | Bronecke ............ | H01L 23/3677 257/E23.105 |
| 8,022,861 | B2 * | 9/2011 | Margomenos ....... | H01Q 21/065 343/700 R |
| 8,110,915 | B2 * | 2/2012 | Fowlkes ................ | H01L 23/66 257/692 |
| 8,729,680 | B2 * | 5/2014 | Kobayashi ........ | H01L 23/49827 257/664 |
| 10,141,182 | B1 * | 11/2018 | Molla ..................... | H01L 23/36 |
| 2004/0000425 | A1 * | 1/2004 | White ..................... | H01L 27/08 174/250 |
| 2004/0125579 | A1 * | 7/2004 | Konishi .............. | H01L 25/0652 257/E23.125 |
| 2005/0093164 | A1 * | 5/2005 | Standing .............. | H05K 3/3485 257/772 |
| 2007/0040255 | A1 | 2/2007 | Osone et al. | |
| 2008/0150065 | A1 * | 6/2008 | Oda ..................... | H01L 31/0203 257/E31.118 |
| 2008/0217753 | A1 * | 9/2008 | Otani .................. | H01L 23/3128 438/126 |
| 2009/0115050 | A1 * | 5/2009 | Kasuya ............... | H01L 23/3677 257/701 |
| 2010/0020499 | A1 * | 1/2010 | Lee ..................... | H01L 23/3677 361/709 |
| 2011/0248389 | A1 * | 10/2011 | Yorita ................. | H01L 25/0652 257/659 |
| 2015/0130072 | A1 * | 5/2015 | Wu .................... | H01L 23/49816 438/109 |
| 2015/0237729 | A1 * | 8/2015 | Brunschwiler ... | H01L 23/49838 29/830 |
| 2016/0027711 | A1 * | 1/2016 | Harada ............. | H01L 23/49827 257/698 |
| 2016/0071781 | A1 * | 3/2016 | Sheridan ............... | H01L 23/345 257/706 |
| 2017/0179050 | A1 * | 6/2017 | Kariyazaki ............. | H01L 23/66 |
| 2017/0179078 | A1 * | 6/2017 | Jung ................. | H01L 25/0652 |
| 2017/0278764 | A1 * | 9/2017 | Partington ............ | H01L 23/045 |
| 2018/0061725 | A1 * | 3/2018 | Meliane .................. | H01L 23/04 |
| 2018/0061726 | A1 * | 3/2018 | Anderson ............... | H01L 23/04 |
| 2018/0063940 | A1 * | 3/2018 | Railkar .................. | H05K 1/115 |
| 2019/0041576 | A1 * | 2/2019 | Byrd .................. | G02B 6/12002 |
| 2019/0103682 | A1 * | 4/2019 | Thai ....................... | H01Q 21/064 |
| 2019/0116670 | A1 * | 4/2019 | Anderson ............ | H01Q 1/2283 |
| 2019/0148342 | A1 * | 5/2019 | Hu ........................ | H01L 25/105 257/659 |
| 2019/0159333 | A1 * | 5/2019 | Sinha ...................... | H01L 23/06 |
| 2019/0245543 | A1 * | 8/2019 | Lee ...................... | H01L 27/1112 |
| 2019/0304876 | A1 * | 10/2019 | Foo ...................... | H01L 24/02 |
| 2019/0326234 | A1 * | 10/2019 | Benson ............... | H01L 23/3677 |
| 2019/0333878 | A1 * | 10/2019 | Wu ...................... | H01L 23/5383 |
| 2019/0393130 | A1 * | 12/2019 | Mahnkopf ............ | H01L 23/481 |
| 2020/0067459 | A1 * | 2/2020 | Ahmed ............ | H01L 23/49811 |
| 2021/0225809 | A1 * | 7/2021 | Yu ........................ | H01L 23/481 |
| 2022/0059427 | A1 * | 2/2022 | Kondo .................. | H05K 1/181 |
| 2022/0208670 | A1 * | 6/2022 | Jones ............... | H01L 23/49833 |

FOREIGN PATENT DOCUMENTS

| | | |
|---|---|---|
| JP | 2005-101368 A | 4/2005 |
| JP | 2005-109005 A | 4/2005 |
| JP | 2006-121147 A | 5/2006 |
| JP | 2007-053148 A | 3/2007 |
| JP | 2012-33885 A | 2/2012 |
| JP | 2013-058515 A | 3/2013 |

* cited by examiner

HIGH-FREQUENCY MODULE AND COMMUNICATION APPARATUS

This application claims priority from Japanese Patent Application No. 2019-018181 filed on Feb. 4, 2019. The content of this application is incorporated herein by reference in its entirety.

BACKGROUND OF THE DISCLOSURE

1. Field of the Disclosure

The present disclosure relates to a high-frequency module and a communication apparatus.

2. Description of the Related Art

In a mobile communication device such as a mobile phone, the number of circuit elements configuring a high-frequency front end circuit is increased particularly in accordance with the progress of multiband technique.

Japanese Unexamined Patent Application Publication No. 2012-33885 discloses a high-frequency module (electronic component module) in which electronic components configuring a high-frequency front end circuit are mounted on both sides of a circuit board. The electronic component mounted on the circuit board is covered with a sealing resin layer, and a connection terminal (pad electrode) to be connected to an external substrate is formed on a surface of the sealing resin layer.

When the high-frequency module disclosed in Japanese Unexamined Patent Application Publication No. 2012-33885 is applied to a high-frequency front end circuit, it is necessary to secure a means for dissipating the heat generated in electronic components mounted on a circuit board.

However, when the heat generation from the electronic component is large, there is a problem that the heat generation of the electronic component is transferred to the electronic component mounted on the opposite surface via the circuit board, thereby deteriorating the characteristics of the high-frequency module.

BRIEF SUMMARY OF THE DISCLOSURE

The present disclosure has been made to solve the above problems, and an object of the present disclosure is to provide a double-sided mounting type high-frequency module with improved heat dissipation performance and a communication apparatus.

In order to achieve the above object, a high-frequency module according to one aspect of the present disclosure includes, a mounting substrate having a first main surface and a second main surface opposed to each other, a first circuit component mounted on the first main surface, a second circuit component mounted on the second main surface, an external connection terminal arranged on the second main surface side relative to the first main surface with respect to the mounting substrate, a long via conductor that is connected to the first circuit component, passes through the mounting substrate, and has a substantially long shape when the mounting substrate is viewed in a plan view, and a metal block that is arranged on the second main surface side relative to the first main surface with respect to the mounting substrate and connects the long via conductor and the external connection terminal, wherein in the plan view, the first circuit component overlaps the long via conductor, and the metal block overlaps the long via conductor.

A high-frequency module according to one aspect of the present disclosure includes, a mounting substrate having a first main surface and a second main surface opposed to each other, a first circuit component mounted on the first main surface, a second circuit component mounted on the second main surface, an external connection terminal arranged on the second main surface side relative to the first main surface with respect to the mounting substrate, a plurality of via conductors that is connected to the first circuit component and passes through the mounting substrate, and a metal block that is arranged on the second main surface side relative to the first main surface with respect to the mounting substrate and connects the plurality of via conductors and the external connection terminal, wherein when the mounting substrate is viewed in a plan view, the first circuit component overlaps the plurality of via conductors, and the metal block overlaps the plurality of via conductors.

A high-frequency module according to one aspect of the present disclosure includes, a mounting substrate having a first main surface and a second main surface opposed to each other, a first circuit component mounted on the first main surface, a second circuit component mounted on the second main surface, an external connection terminal arranged on the second main surface side relative to the first main surface with respect to the mounting substrate, a via conductor connected to the first circuit component and passing through the mounting substrate, and a columnar electrode made of Cu, which is arranged on the second main surface side relative to the first main surface with respect to the mounting substrate and which is connected to the via conductor and the external connection terminal, wherein when the mounting substrate is viewed in a plan view, the first circuit component overlaps the via conductor, and the columnar electrode overlaps the via conductor.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Figure 1A:
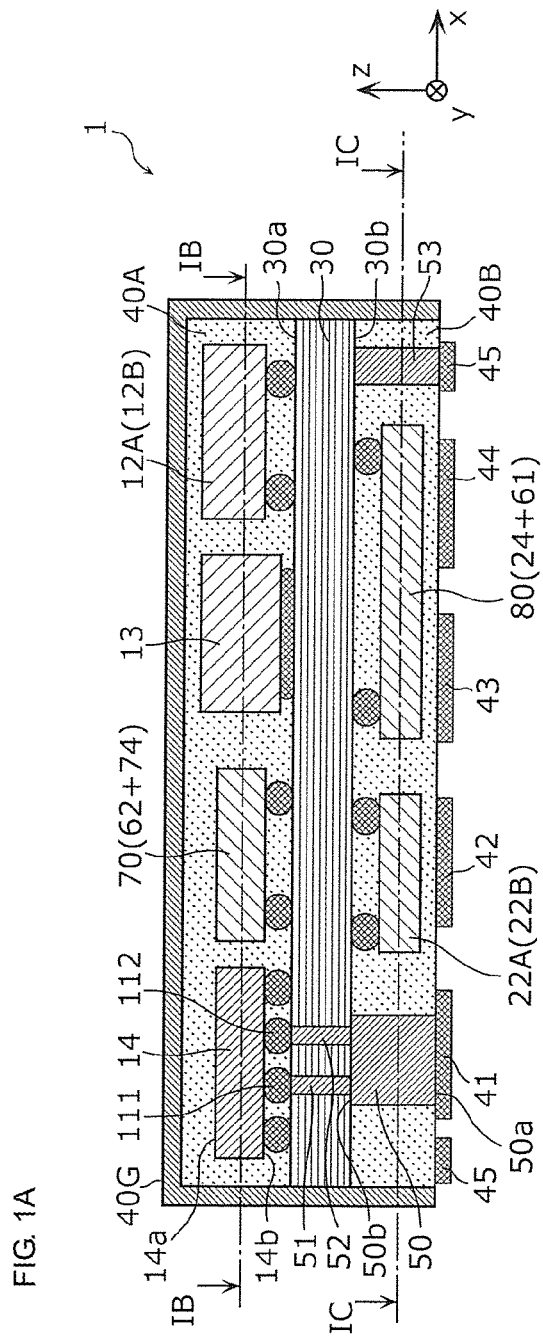
FIG. 1A is a first cross-sectional configuration diagram of a high-frequency module according to a first embodiment.

Hereinafter, embodiments of the present disclosure will be described in detail with reference to the accompanying drawings. Note that the embodiments described below are all inclusive or specific examples. The numerical values, shapes, materials, constituent elements, arrangement and connection configurations of the constituent elements shown in the following embodiments are merely examples, and are not intended to limit the present disclosure. Among the constituent elements in the following embodiments, constituent elements that are not described in the independent claims will be described as arbitrary constituent elements. Also, the size or ratio of size of the constituent elements illustrated in the drawings is not necessarily precise.

Note that in this specification, "X and Y are connected" includes a case where X and Y are connected via a conductive bonding member such as solder, a bump electrode, and a columnar electrode, and a case where X and Y are directly connected to each other without the bonding member. Also, "X and Y are electrically connected" includes a case where X and Y are connected to each other via a wiring, and a case where X and Y are indirectly connected via a resistance component (resistance element or resistance wiring).

First Embodiment

Figure 1B:
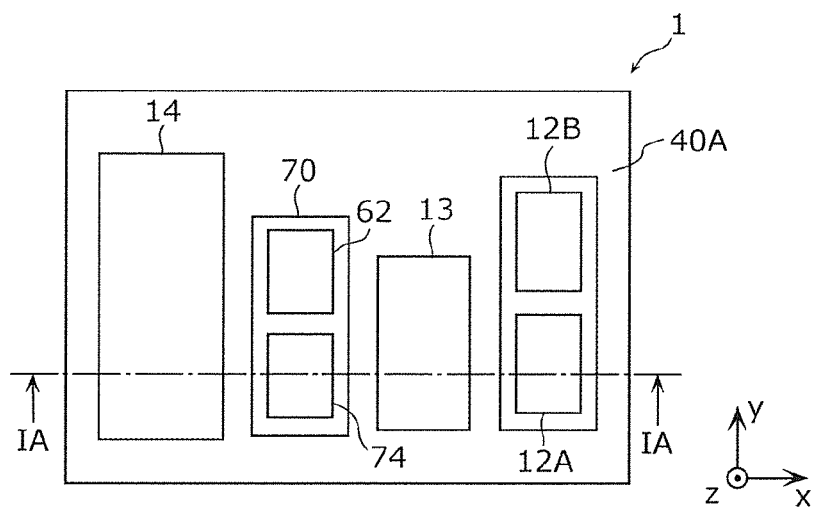
FIG. 1B is a second cross-sectional configuration diagram of the high-frequency module according to the first embodiment.
Figure 1C:
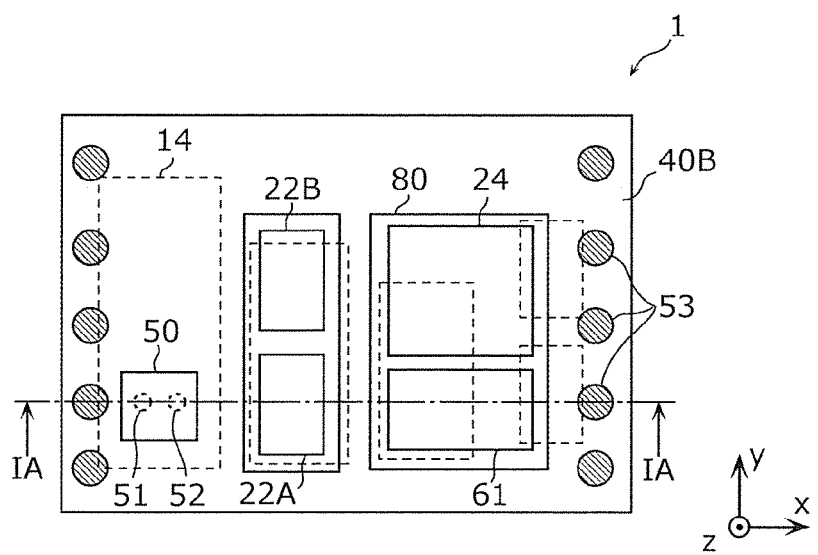
FIG. 1C is a third cross-sectional configuration diagram of the high-frequency module according to the first embodiment.

1-1. Configuration of High-Frequency Module 1 According to First Embodiment FIG. 1A is a first cross-sectional configuration diagram of a high-frequency module 1 according to a first embodiment. In addition, FIG. 1B is a second cross-sectional configuration diagram of the high-frequency module 1 according to the first embodiment. In addition, FIG. 1C is a third cross-sectional configuration diagram of the high-frequency module 1 according to the first embodiment. More specifically, FIG. 1A is a cross-sectional view of an IA-IA cut plane of FIG. 1B and FIG. 1C as viewed in a y-axis positive direction. In addition, FIG. 1B is a cross-sectional view of an IB-IB cut plane of FIG. 1A as viewed in a z-axis negative direction. In addition, FIG. 1C is a cross-sectional view of an IC-IC cut plane of FIG. 1A as viewed in the z-axis negative direction. Note that FIG. 1C illustrates not only circuit elements and terminals (solid lines) arranged on the cut plane but also circuit elements (broken lines) that are present when seen in the z-axis direction.

As illustrated in FIG. 1A, the high-frequency module 1 includes a mounting substrate 30, a power amplifier 14, semiconductor ICs 70 and 80, a matching circuit 13, transmission filters 12A and 12B, reception filters 22A and 22B, resin members 40A and 40B, via conductors 51 and 52, a metal block 50, a columnar electrode 53, connection terminals 41, 42, 43, 44, and 45, and a shield electrode layer 40G.

The high-frequency module 1 can be connected to an external substrate arranged on the z-axis negative direction side of the high-frequency module 1 via the connection terminals 41 to 45. The external substrate corresponds to, for example, a mother substrate of such as a mobile phone and a communication device.

As illustrated in FIG. 1B, the power amplifier 14, the semiconductor IC 70, the matching circuit 13, the transmission filters 12A and 12B are mounted on a main surface 30a. Further, as illustrated in FIG. 1C, the metal block 50, the reception filters 22A and 22B, and the semiconductor IC 80 are mounted on a main surface 30b.

A specific example of the circuit configuration of the high-frequency module 1 will be described below.

Figure 2A:
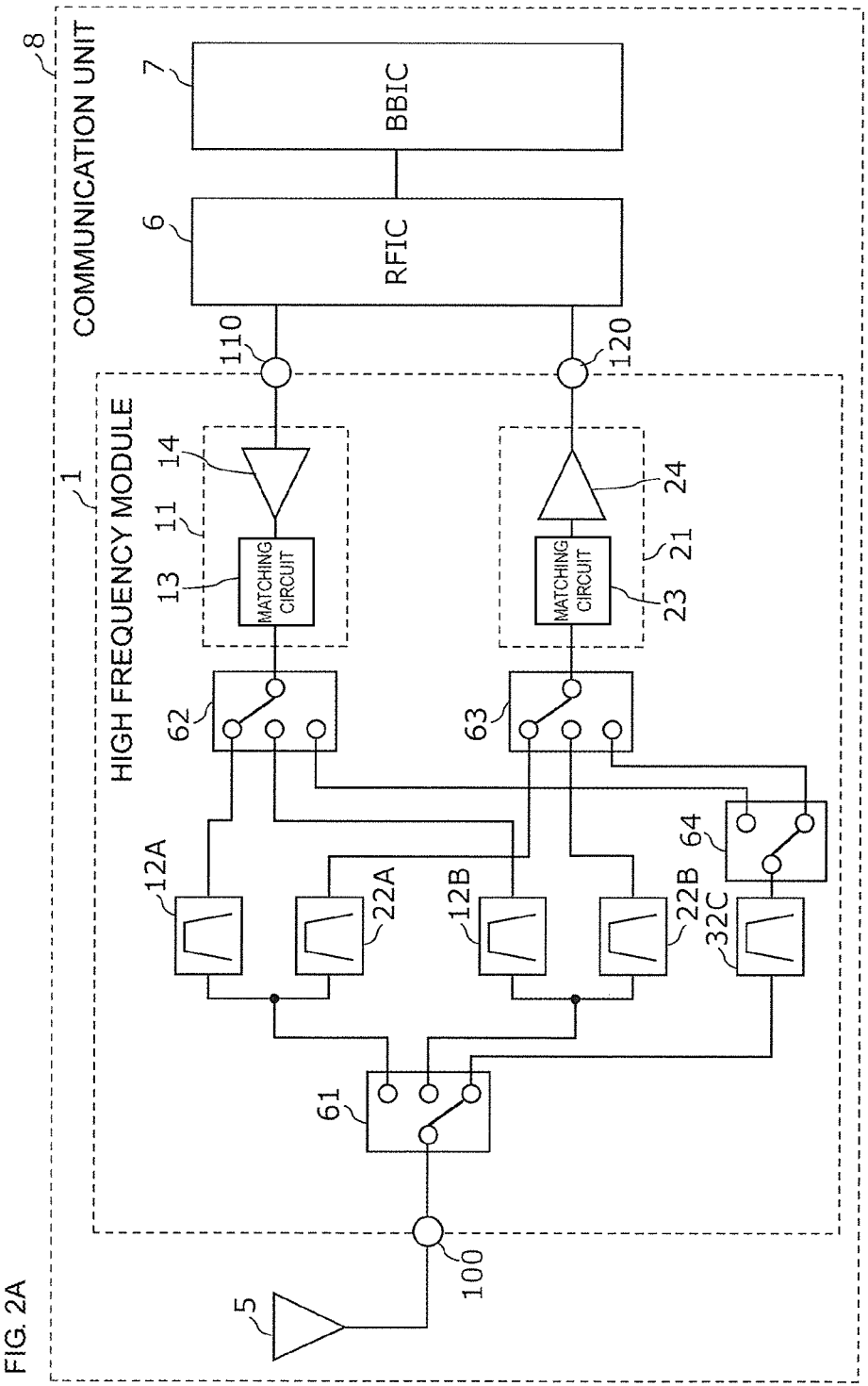
FIG. 2A is a diagram illustrating an example of a circuit configuration of the high-frequency module and a communication apparatus according to the first embodiment.

FIG. 2A is a diagram illustrating an example of a circuit configuration of the high-frequency module 1 and a communication apparatus 8 according to the first embodiment. The figure illustrates the high-frequency module 1 according to this embodiment, a common input/output terminal 100, a transmission input terminal 110, a reception output terminal 120, an antenna element 5, an RF signal processing circuit (RFIC) 6, and a baseband signal processing circuit (BBIC) 7. The circuit configuration of the high-frequency module 1 illustrated in the figure is an example of the circuit configuration of the high-frequency module 1 illustrated in FIG. 1A to FIG. 1C. Further, the high-frequency module 1, the antenna element 5, the RFIC 6, and the BBIC 7 configure the communication apparatus 8.

The high-frequency module 1 includes a transmission amplifier circuit 11, a reception amplifier circuit 21, the transmission filters 12A and 12B, the reception filters 22A and 22B, a transmission/reception filter 32C, and switches 61, 62, 63, and 64.

The transmission filter 12A is, for example, a filter element whose pass band is the transmission band of a band (frequency band) A. The transmission filter 12B is, for example, a filter element whose pass band is the transmission band of a band (frequency band) B. The reception filter 22A is, for example, a filter element whose pass band is the reception band of the band (frequency band) A. The reception filter 22B is, for example, a filter element whose pass band is the reception band of the band (frequency band) B. Incidentally, the transmission filter 12A and the reception filter 22A may configure a duplexer for the band A. Also, the transmission filter 12B and the reception filter 22B may configure a duplexer for the band B. The transmission/reception filter 32C is, for example, a filter element whose pass band is the transmission/reception band of a band (frequency band) C.

The switch 61 is a switch circuit of a single pole three throw (SP3T) type that has a common terminal and three selection terminals, the common terminal being electrically connected to the common input/output terminal 100, the three selection terminals being electrically connected to a connection terminal of the transmission filter 12A and the reception filter 22A, a connection terminal of the transmission filter 12B and the reception filter 22B, and the transmission/reception filter 32C, respectively. The switch 61 has a function of switching signal paths for the band A, the band B, and the band C. Note that the switch 61 may be a switch circuit that couples the common terminal and at least one of the three selection terminals.

The switch 62 is a SP3T type switch circuit that has a common terminal and three selection terminals, the common terminal being electrically connected to the transmission amplifier circuit 11, the three selection terminals being electrically connected to the input terminal of the transmission filter 12A, the input terminal of the transmission filter 12B, and one of selection terminals of the switch 64, respectively. The switch 62 has a function of switching transmission signal paths for the band A, the band B, and the band C. Note that the switch 62 may be a switch circuit that couples the common terminal and at least one of the three selection terminals.

The switch 63 is a SP3T type switch circuit that has a common terminal and three selection terminals, the common terminal being electrically connected to the reception amplifier circuit 21, the three selection terminals being electrically connected to the output terminal of the reception filter 22A, the output terminal of the reception filter 22B, and another selection terminal of the switch 64, respectively. The switch 63 has the function of switching reception signal paths for the band A, the band B, and the band C. Note that the switch 63 may be a switch circuit that couples the common terminal and at least one of the three selection terminals.

The switch 64 is a single pole double throw (SPDT) type switch circuit having a common terminal and two selection terminals, the common terminal being electrically connected to the transmission/reception filter 32C. The switch 64 has a function of switching a signal path including the transmission/reception filter 32C to a transmission signal path or a reception signal path.

The reception amplifier circuit 21 is an amplification circuit having a matching circuit 23 and a low noise amplifier 24, and amplifies a high-frequency reception signal inputted from the switch 63 and outputs the amplified high-frequency reception signal to the reception output terminal 120. The low noise amplifier 24 is, for example, an amplifying element having a bipolar transistor. The matching circuit 23 is a circuit for matching output impedance of the reception filters 22A and 22B, and the transmission/reception filter 32C with input impedance of the low noise amplifier 24, and is configured of, for example, passive elements such as inductors and capacitors.

The transmission amplifier circuit 11 is an amplifier circuit having the matching circuit 13 and the power amplifier 14, and amplifies a high-frequency transmission signal inputted from the transmission input terminal 110. The matching circuit 13 is a circuit for matching output impedance of the power amplifier 14 with input impedance of the transmission filters 12A and 12B, and the transmission/reception filter 32C, and is configured of, for example, passive elements such as inductors and capacitors.

The low noise amplifier 24 and the power amplifier 14 are configured by, for example, a complementary metal oxide semiconductor (CMOS), an electric field effect transistor (FET) using GaAs as a material, a heterojunction bipolar transistor (HBT), and the like.

Here, a circuit configuration of the power amplifier 14 will be exemplified.

Figure 2B:
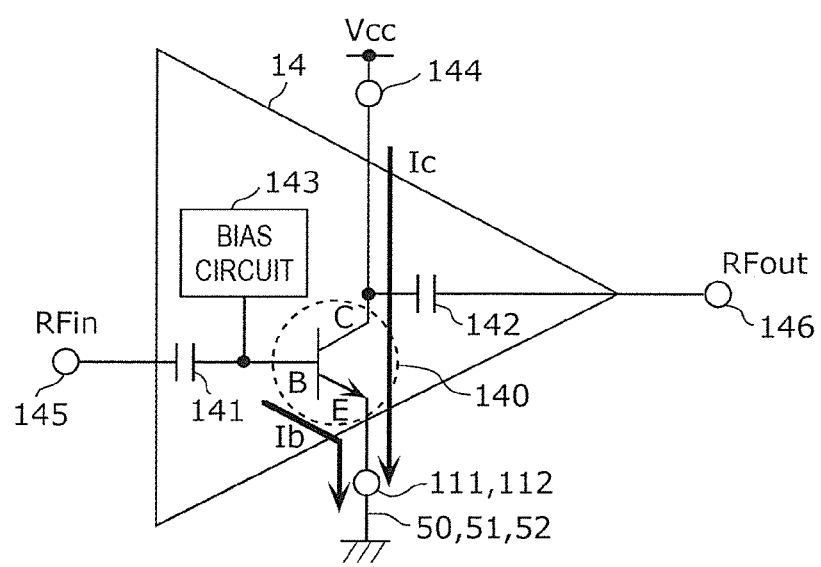
FIG. 2B is a diagram illustrating an example of a circuit configuration of a power amplifier included in the high-frequency module according to the first embodiment.

FIG. 2B is a diagram illustrating an example of a circuit configuration of the power amplifier 14 included in the high-frequency module 1 according to the first embodiment. As illustrated in the figure, the power amplifier 14 includes a transistor 140, capacitors 141 and 142, a bias circuit 143, a collector terminal 144, an emitter terminal (bump electrodes 111 and 112), an input terminal 145, and an output terminal 146.

The transistor 140 has, for example, a collector, an emitter, and a base, is an emitter-grounded bipolar transistor, and amplifies a high-frequency current inputted to the base to output the amplified high-frequency current from the collector. Note that the transistor 140 may be an electric field-effect transistor having a drain, a source, and a gate.

The capacitor 141 is a capacitance element for DC cutting, and has a function of preventing the leakage of a DC current to the input terminal 145 by a DC bias voltage applied to the base from the bias circuit 143.

The capacitor 142 is a capacitance element for DC cutting, and has a function of removing a DC component of a high-frequency amplified signal on which a DC bias voltage is superposed, and a high-frequency amplified signal from which the DC component is removed is outputted from the output terminal 146.

The bias circuit 143 is electrically connected to the base of the transistor 140, and has a function of optimizing an operating point of the transistor 140 by applying a bias voltage to the base.

According to the circuit configuration of the power amplifier 14, a high-frequency signal RFin inputted from the input terminal 145 becomes a base current Ib flowing from the base of the transistor 140 to the emitter. The base current Ib is amplified by the transistor 140 to become a collector current Ic, and a high-frequency signal RFout corresponding to the collector current Ic is outputted from the output terminal 146. At this time, a large current in which the base current Ib and the collector current Ic are combined flows from the emitter terminal (bump electrodes 111 and 112) to the ground through the via conductors 51 and 52 and the metal block 50.

Note that the power amplifier 14 may have a configuration in which a plurality of transistors 140 is cascade-connected, and in this case, a plurality of base terminals, collector terminals, and emitter terminals may be provided.

Referring back to FIG. 2A, a configuration of the communication apparatus 8 will be described.

The RFIC 6 processes a high-frequency reception signal inputted from the antenna element 5 via the high-frequency module 1 by down-conversion or the like, and outputs the received signal generated by the signal processing to the BBIC 7.

The BBIC 7 is a circuit that performs signal processing by using an intermediate frequency band having a lower frequency than the high-frequency signal at a front end portion. The signal processed in the BBIC 7 is used, for example, as an image signal for image display, or as a voice signal for communication via a speaker.

With the above configuration, the high-frequency module 1 can select and transmit each of the high-frequency signal of the band A, the high-frequency signal of the band B, and the high-frequency signal of the band C by switching operation of the switches 61 to 64. Note that the high-frequency module 1 is applicable to a (non-CA) mode in which each of transmission/reception signals of the three frequency bands is transmitted independently, and also to a (CA) mode in which two or more transmission/reception signals of the transmission/reception signals of the three frequency bands are transmitted simultaneously.

Although the high-frequency module 1 which is a transmission and reception demultiplexing/multiplexing circuit is illustrated as a high-frequency module in this embodiment, the high-frequency module according to the present disclosure may be a transmission multiplexing circuit or a reception demultiplexing circuit, and the number of frequency bands (signal paths) is not limited.

In addition to the circuit configuration illustrated in FIG. 2A, electronic components such as a capacitor, an inductor, a resistance element, and the like may be arranged at a node for electrically connecting the circuit elements.

Here, referring back to FIG. 1A, the configuration of the high-frequency module 1 will be described.

The mounting substrate 30 is a double-sided mounting substrate that has the main surface 30a and the main surface 30b opposed to each other, circuit components being respectively mounted on the main surfaces 30a and 30b. The main surface 30a is a first main surface on a z-axis positive direction side of the mounting substrate 30, and the main surface 30b is a second main surface on the z-axis negative direction side of the mounting substrate 30. The mounting substrate 30 is a substrate made of a dielectric member or a multilayer substrate in which a plurality of dielectric layers is laminated, and examples thereof include a PCB substrate and a ceramic multilayer substrate.

The power amplifier 14 is a first circuit component mounted on the main surface 30a, and is a transmission amplifier for amplifying a high-frequency transmission signal. The power amplifier 14 has a main surface 14b (third main surface) opposed to the main surface 30a, and a main surface 14a (fourth main surface) opposed to the main surface 14b. Further, the power amplifier 14 has the bump electrodes 111 and 112 formed on the main surface 14b. As illustrated in FIG. 2B, the bump electrodes 111 and 112 correspond to, for example, the emitter terminal.

The semiconductor IC 70 is a circuit component mounted on the main surface 30a, and includes the switch 62 and a control circuit 74. The control circuit 74 is a digital control circuit for controlling, for example, a gain of the power amplifier 14 and the switching of the connection of the switch 62.

The semiconductor IC 80 is a second circuit component mounted on the main surface 30b, and includes the low noise amplifier 24 and the switch 61.

The semiconductor ICs 70 and 80 are configured by, for example, CMOS. This makes it possible to manufacture the semiconductor IC at a low cost. Note that the semiconductor ICs 70 and 80 may be made of GaAs. This makes it possible to output a high-frequency signal having high quality amplification performance and noise performance.

The connection terminals 41 to 45 are an example of an external connection terminal, and are arranged on the main surface 30b side relative to the mounting substrate 30 and also on a surface of the resin member 40B on the z-axis negative direction side. The connection terminal 41 is connected to the metal block 50, and can be connected to an external substrate arranged on the z-axis negative direction side of the high-frequency module 1. The connection terminals 41 to 45 may be a planar conductor pattern formed on the surface of the resin member 40B on the z-axis negative direction side, or may be a solder ball electrode. In a case where the connection terminals 41 to 45 are a solder ball electrode, a process of applying solder paste on the electrode of the external substrate can be omitted in a mounting process of the high-frequency module 1 on the external substrate, so that the mounting process can be simplified. The connection terminal 41 may be a plating layer or the like formed on a forefront surface in the z-axis negative direction of the metal block 50.

The via conductor 51 is connected to the power amplifier 14, and passes through the mounting substrate 30. The via conductor 52 is connected to the power amplifier 14, and passes through the mounting substrate 30. More specifically, in the via conductor 51, an end surface on the side of the main surface 30a is connected to the bump electrode 111, and an end surface on the side of the main surface 30b is connected to the metal block 50. In addition, the via conductor 52 has an end surface on the side of the main surface 30a connected to the bump electrode 112, and an end surface on the side of the main surface 30b connected to the metal block 50. The via conductors 51 and 52 are a plurality of via conductors connected to the power amplifier 14 and passing through the mounting substrate 30. The number of the via conductors for connecting the power amplifier 14 and the metal block 50 is not limited to two, but may be three or more.

The metal block 50 is arranged on the main surface 30b side with respect to the mounting substrate 30, and is connected to the via conductors 51 and 52 and the connection terminal 41. More specifically, the metal block 50 has a main surface 50b (fifth main surface) bonded to the main surface 30b and a main surface 50a (sixth main surface) bonded to the connection terminal 41, and the main surface 50b is connected to the via conductors 51 and 52, and the main surface 50a is connected to the connection terminal 41. A material of the metal block 50 is not particularly limited, and may be a metal having high conductivity such as Ag, Al, Cu or the like.

The metal block 50 is not formed by filling a metal paste in a through-recess portion provided in a resin on the main surface 30b, for example, but is mounted on the mounting substrate 30 by solder-bonding of a metal block body formed in advance to the main surface 30b. In this mounting process, the metal block 50 is bonded to the main surface 30b using solder. Thus, the metal block 50 can be mounted in the same mounting process as the power amplifier 14 and the semiconductor IC 80, so that the manufacturing process of the high-frequency module 1 can be simplified.

The columnar electrode 53 is a substantially columnar conductor that connects the main surface 30b and the connection terminal 45, and that passes through the resin member 40B. The connection terminal 45 is, for example, a ground terminal, and the columnar electrode 53 is a ground electrode.

The resin member 40A is formed on the main surface 30a, and covers a side surface and a top surface of the power amplifier 14, a side surface and a top surface of the semiconductor IC 70, side surfaces and a top surface of the transmission filters 12A and 12B, and a side surface and a top surface of the matching circuit 13. It should be noted that the resin member 40A may cover at least the side surface of the power amplifier 14.

Since the power amplifier 14 having a large heat generation amount is covered with the resin member 40A due to the arrangement of the resin member 40A, the heat dissipation performance from the power amplifier 14 to the external substrate is improved while enhancing the mounting reliability of the power amplifier 14.

The resin member 40B is formed on the main surface 30b, and covers a side surface of the metal block, a side surface and a top surface of the semiconductor IC 80, a side surface and a top surface of the reception filters 22A and 22B, and a side surface of the columnar electrode 53. It should be noted that the resin member 40B may cover at least a side surface of the metal block 50.

Since the metal block 50 is covered with the resin member 40B by the arrangement of the resin member 40B, the heat dissipation performance from the power amplifier 14 to the external substrate is improved while enhancing the mounting reliability of the metal block 50.

The shield electrode layer 40G is formed to cover a top surface and a side surface of the resin member 40A and a side surface of the resin member 40B, and is connected to the ground conductor formed in the mounting substrate 30 at a side surface of the mounting substrate 30. Thereby, the transmission signal of the power amplifier 14 can be suppressed from being directly radiated to the outside from the high-frequency module 1, and external noise can be suppressed from entering the circuit components of the high-frequency module 1. Further, the heat generated in the power amplifier 14 can be dissipated through the shield electrode layer 40G, so that the heat dissipation performance of the high-frequency module 1 is improved.

The electrode formed on the main surface 14b of the power amplifier 14 may not be a bump electrode, but may be a connection electrode formed of a planar conductor pattern on the main surface 14b. In this case, the connection electrode and the via conductors 51 and 52 are connected to each other using solder.

Here, as illustrated in FIG. 1A and FIG. 1C, when the mounting substrate 30 is viewed in a plan view, the power amplifier 14 overlaps the via conductors 51 and 52. Further, the metal block 50 overlaps the via conductors 51 and 52.

According to this configuration, since the power amplifier 14 is bonded to the plurality of via conductors 51 and 52, a large contact area between the power amplifier 14 and the via conductor in the mounting substrate 30 can be secured. Further, since the metal block 50 is bonded to the plurality of via conductors 51 and 52, a large contact area between the metal block 50 and the via conductor in the mounting substrate 30 can be secured. Further, since the via conductors 51 and 52 overlap the power amplifier 14 and the metal block 50 in the plan view, the power amplifier 14 and the metal block 50 can be connected by a wiring path in a direction (z-axis direction) perpendicular to the mounting substrate 30. That is, the power amplifier 14 and the metal block 50 can be connected to each other by a substantially shortest path. Therefore, the heat generated in the power amplifier 14 can be dissipated by a heat dissipation path having high thermal conductivity such as the via conductors 51 and 52, the metal block 50, and the connection terminal 41. For this reason, the heat generated in the power amplifier 14 can be efficiently dissipated from the connection terminal 41 to the outside while suppressing the transfer of the heat to the circuit components mounted on the main surface 30b. Accordingly, it is possible to provide the high-frequency module 1 of the double-sided mounting type with improved heat dissipation performance and the communication apparatus 8 including the high-frequency module 1.

In this specification, as being mounted on the substrate, "X and Y are overlapped when the mounting substrate is viewed in a plan view" is defined as a state in which X and Y are arranged in a manner such that half or more of a projected area of X overlaps Y in the plan view, or half or more of a projected area of Y overlaps X.

Further, the power amplifier 14 having a large heat generation amount is mounted on the main surface 30a, and the via conductors 51 and 52 formed on the mounting substrate 30 are connected to the emitter terminal (bump electrodes 111 and 112) of the power amplifier 14, and are connected to the metal block 50 mounted on the main surface 30b. As a result, the heat dissipation path through only a plane wiring pattern along an xy plane direction having a large thermal resistance among the wirings in the mounting substrate 30 can be eliminated. Therefore, it is possible to provide a small-sized high-frequency module 1 in which the heat dissipation performance from the power amplifier 14 to the external substrate is improved.

Further, in this embodiment, since the power amplifier 14 and the low noise amplifier 24 are arranged while sandwiching the mounting substrate 30, the isolation between them can be secured, and the interference of the transmission signal and the reception signal can be suppressed. In particular, it is possible to suppress the transmission signal which is a large electric power from entering the reception path and suppress the reduction in the reception sensitivity.

Note that, in the high-frequency module 1 according to the first embodiment, instead of the via conductors 51 and 52, one long via conductor having a substantially long shape may be arranged when the mounting substrate 30 is viewed in a plan view. The long via conductor is connected to the power amplifier 14, and passes through the mounting substrate 30. More specifically, in the long via conductor, an end surface on the main surface 30a side is connected to the bump electrodes 111 and 112, and an end surface on the main surface 30b side is connected to the metal block 50. In the above plan view, the power amplifier 14 overlaps the long via conductor. Further, the metal block 50 overlaps the long via conductor.

According to this configuration, since the power amplifier 14 is bonded to the long via conductor, a large contact area between the power amplifier 14 and the via conductor in the mounting substrate 30 can be secured. Further, since the metal block 50 is bonded to the long via conductor, a large contact area between the metal block 50 and the via conductor in the mounting substrate 30 can be secured. In addition, since the long via conductor overlaps the power amplifier 14 and the metal block 50 in the plan view, the power amplifier 14 and the metal block 50 can be connected by a wiring path in a direction (z-axis direction) perpendicular to the mounting substrate 30. That is, the power amplifier 14 and the metal block 50 can be connected to each other by a substantially shortest path. Therefore, the heat generated in the power amplifier 14 can be dissipated by the heat dissipation path having high thermal conductivity, such as the long via conductor, the metal block 50, and the connection terminal 41. For this reason, the heat generated in the power amplifier 14 can be efficiently dissipated from the connection terminal 41 to the outside while suppressing the transfer of the heat to the circuit components mounted on the main surface 30b. Accordingly, it is possible to provide the high-frequency module 1 of the double-sided mounting type with improved heat dissipation performance and the communication apparatus 8 including the high-frequency module 1.

Note that, in the high-frequency module 1 according to the present embodiment, a total area of the via conductors 51 and 52 in the plan view and an area of the metal block 50 in the plan view may be larger than a total area of the bump electrodes 111 and 112 in the plan view.

According to this configuration, since areas of the via conductors 51 and 52 and the metal block 50 in the plan view, which tend to be relatively high in height, are larger than areas of the bump electrodes 111 and 112 in the plan view which tend to be relatively low in height, the bump electrodes 111 and 112, the via conductors 51 and 52, and the metal block 50 have substantially the same amount of heat dissipation capacitance respectively so that matching of heat dissipation performance may be achieved, and thus the heat dissipation performance of the high-frequency module 1 can be improved.

Further, the first circuit components mounted on the main surface 30a and connected to the via conductors 51 and 52 and the metal block 50 may not be the power amplifier 14, but may be the low noise amplifier 24. Furthermore, it does not need to be an amplifier such as the power amplifier 14 and the low noise amplifier 24, but it is sufficient to be a heat-generating circuit component.

Note that in the high-frequency module 1 according to the first embodiment, it is sufficient that at least one of the semiconductor IC 80, the reception filters 22A and 22B may be mounted on the main surface 30b. Moreover, it is sufficient that at least the power amplifier 14 may be mounted on the main surface 30a. That is, in the high-frequency module 1 according to the first embodiment, the semiconductor ICs 70 and 80, the matching circuit 13, the transmission filters 12A and 12B, the reception filters 22A and 22B, the resin members 40A and 40B, the columnar electrode 53, the connection terminals 42 to 45, and the shield electrode layer 40G are not essential components.

Figure 3A:
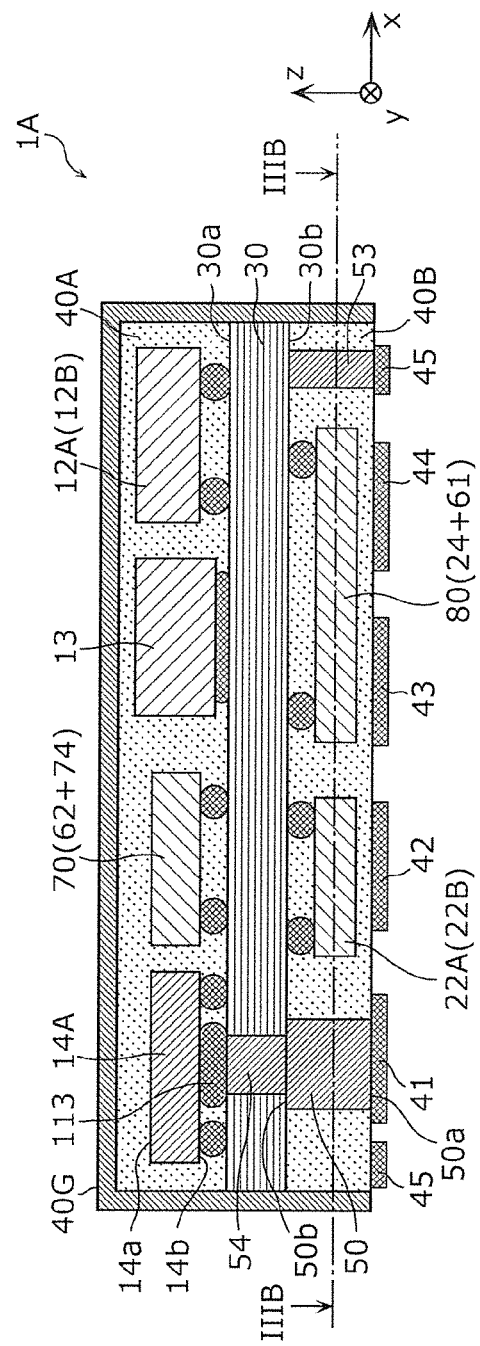
FIG. 3A is a first cross-sectional configuration diagram of a high-frequency module according to a first modification of the first embodiment.
Figure 3B:
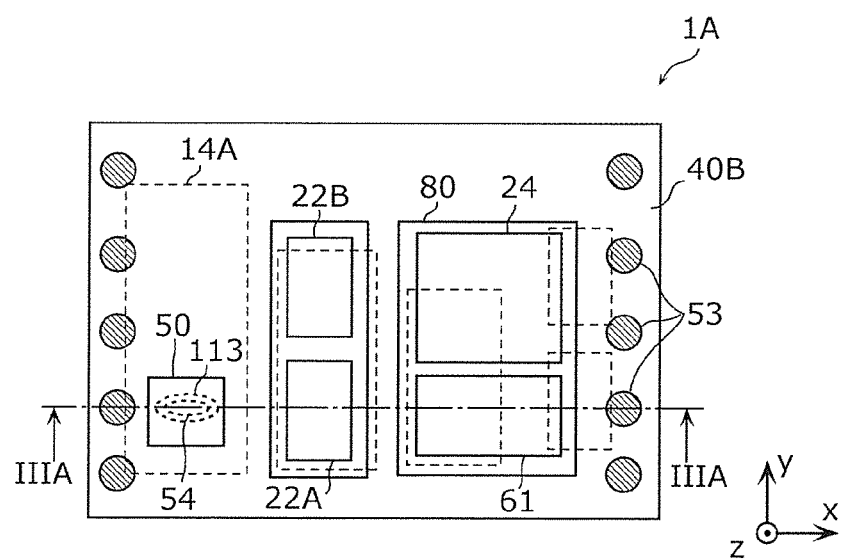
FIG. 3B is a second cross-sectional configuration diagram of the high-frequency module according to the first modification of the first embodiment.

1-2. Configuration of High-Frequency Module 1A According to First Modification FIG. 3A is a first cross-sectional configuration diagram of a high-frequency module 1A according to a first modification of the first embodiment. Further, FIG. 3B is a second cross-sectional configuration diagram of the high-frequency module 1A according to the first modification of the first embodiment. More specifically, FIG. 3A is a cross-sectional view of an IIIA-IIIA cut plane of FIG. 3B as viewed in the y-axis positive direction. In addition, FIG. 3B is a cross-sectional view of an IIIB-IIIB cut plane of FIG. 3A as viewed in the z-axis negative direction. Note that, FIG. 3B illustrates not only the circuit elements and terminals (solid lines) arranged on the cut plane but also circuit elements (broken lines) that are present when seen in the z-axis direction.

As illustrated in FIG. 3A and FIG. 3B, the high-frequency module 1A includes the mounting substrate 30, a power amplifier 14A, the semiconductor ICs 70 and 80, the matching circuit 13, the transmission filters 12A and 12B, the reception filters 22A and 22B, the resin members 40A and 40B, a long via conductor 54, the metal block 50, the columnar electrode 53, the connection terminals 41, 42, 43, 44, and 45, and the shield electrode layer 40G. The power amplifier 14A, the semiconductor IC 70, the matching circuit 13, and the transmission filters 12A and 12B are mounted on the main surface 30a. The metal block 50, the reception filters 22A and 22B, and the semiconductor IC 80 are mounted on the main surface 30b.

The high-frequency module 1A according to this modification differs from the high-frequency module 1 according to the first embodiment in the electrode configuration of the power amplifier 14A and the configuration of the long via conductor 54. Hereinafter, descriptions of the same points in the high-frequency module 1A according to this modification as the high-frequency module 1 according to the first embodiment will be omitted, and different points will be mainly described.

The power amplifier 14A is the first circuit component mounted on the main surface 30a, and is a transmission amplifier for amplifying the high-frequency transmission signal. The power amplifier 14A has the main surface 14b (third main surface) opposed to the main surface 30a, and the main surface 14a (fourth main surface) opposed to the main surface 14b. Moreover, the power amplifier 14A has a long bump electrode 113 formed on the main surface 14b having a substantially long shape when the mounting substrate 30 is viewed in a plan view. As illustrated in FIG. 2B, the long bump electrode 113 corresponds to, for example, an emitter terminal.

The long via conductor 54 is a via conductor which is connected to the power amplifier 14A, passes through the mounting substrate 30, and has a substantially long shape when viewed in the plan view. More specifically, in the long via conductor 54, an end surface on the main surface 30a side is connected to the long bump electrode 113, and an end surface on the main surface 30b side is connected to the metal block 50. Note that the long via conductor 54 connecting the power amplifier 14A and the metal block 50 is not limited to one, and may be two or more.

Here, as illustrated in FIG. 3B, the long bump electrode 113 and the long via conductor 54 have longitudinal directions that coincide with each other in the plan view, and are connected in a state of at least partially overlapping each other. Further, the metal block 50 overlaps the long via conductor 54.

According to this configuration, it is possible to secure a large contact area between the power amplifier 14A and the long via conductor 54, and to secure a large contact area between the long via conductor 54 and the metal block 50. Further, since the long via conductor 54 overlaps the power amplifier 14A and the metal block 50 in the plan view, the power amplifier 14A and the metal block 50 can be connected by a wiring path in a direction (z-axis direction) perpendicular to the mounting substrate 30. That is, the power amplifier 14A and the metal block 50 can be connected to each other by a substantially shortest path. Therefore, the heat generated in the power amplifier 14A can be dissipated by a heat dissipation path having high thermal conductivity such as the long bump electrode 113, the long via conductor 54, the metal block 50, and the connection terminal 41. For this reason, the heat generated in the power amplifier 14A can be efficiently dissipated from the connection terminal 41 to the outside while suppressing the transfer of the heat to the circuit components mounted on the main surface 30b. Therefore, it is possible to provide the double-sided mounting type high-frequency module 1A with improved heat dissipation performance.

In the high-frequency module 1A according to this modification, the metal block 50 may have a substantially long shape in the plan view, and the metal block 50 and the long via conductor 54 may have longitudinal directions that coincide with each other in the plan view, and may be connected in a state of at least partially overlapping each other.

According to this configuration, a large contact area between the metal block 50 and the long via conductor 54 can be secured. Therefore, the heat generated in the power amplifier 14A can be dissipated by a heat dissipation path having high thermal conductivity, such as the power amplifier 14A, the long via conductor 54, the long metal block 50, and the connection terminal 41. Therefore, it is possible to enhance the heat dissipation performance of the high-frequency module 1A while suppressing the heat generated in the power amplifier 14A from being transferred to the circuit components mounted on the main surface 30b.

Figure 4:
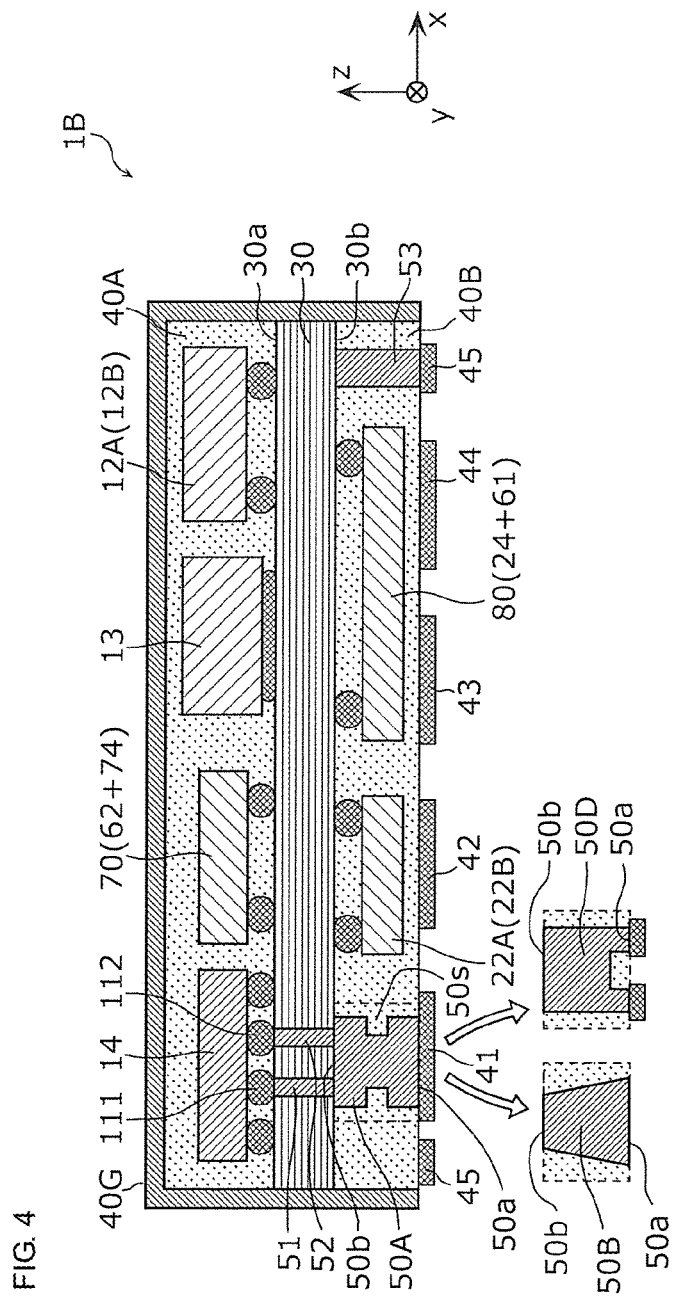
FIG. 4 is a cross-sectional configuration diagram of a high-frequency module according to a second modification of the first embodiment.

1-3. Configuration of High-Frequency Module 1B According to Second Modification FIG. 4 is a cross-sectional configuration diagram of a high-frequency module 1B according to a second modification of the first embodiment. As illustrated in the figure, the high-frequency module 1B includes the mounting substrate 30, the power amplifier 14, the semiconductor ICs 70 and 80, the matching circuit 13, the transmission filters 12A and 12B, the reception filters 22A and 22B, the resin members 40A and 40B, the via conductors 51 and 52, a metal block 50A, the columnar electrode 53, the connection terminals 41, 42, 43, 44, and 45, and the shield electrode layer 40G. As illustrated in FIG. 4, the power amplifier 14, the semiconductor IC 70, the matching circuit 13, the transmission filters 12A and 12B are mounted on the main surface 30a. In addition, the metal block 50A, the reception filters 22A and 22B, and the semiconductor IC 80 are mounted on the main surface 30b.

The high-frequency module 1B according to this modification differs from the high-frequency module 1 according to the first embodiment in the configuration of the metal block 50A. Hereinafter, descriptions of the same points in the high-frequency module 1B according to this modification as the high-frequency module 1 according to the first embodiment will be omitted, and different points will be mainly described.

The metal block 50A has the main surface 50b (fifth main surface) bonded to the main surface 30b, the main surface 50a (sixth main surface) opposed to the main surface 50b, and a side surface connecting the main surface 50a and the main surface 50b. A recess portion 50s is formed in the side surface. The resin member 40B is in contact with the recess portion 50s.

According to this configuration, since the resin member 40B enters the recess portion 50s, it is possible to suppress the metal block 50A from being detached from the main surface 30b. Therefore, the mechanical reliability of the high-frequency module 1B is improved.

The recess portion 50s may be a groove portion along the direction parallel to the main surfaces 50a and 50b on the side surface. As such, the mechanical reliability of the high-frequency module 1B is improved.

Further, as illustrated in FIG. 4, a metal block 50B may be arranged in place of the metal block 50A. The metal block 50B has the main surface 50b (fifth main surface) bonded to the main surface 30b and the main surface 50a (sixth main surface) opposed to the main surface 50b, and an area of the main surface 50b is smaller than an area of the main surface 50a.

According to this configuration, since the main surface 50a is wider than the main surface 50b, the thermal diffusion of the heat generated from the power amplifier 14 can be efficiently performed, and the contact area between the connection terminal 41 and the metal block 50B can be increased. As such, the heat dissipation performance to the connection terminal 41 can be improved. Further, since the main surface 50b is narrower than the main surface 50a, the degree of freedom in the layout of the circuit components mounted on the main surface 30b can be improved.

In the metal block 50B, it is preferable that a cross section cut along a plane parallel to the main surfaces 50a and 50b decrease from the main surface 50a toward the main surface 50b.

Instead of the metal blocks 50A and 50B, for example, a metal block 50D in which a part of the main surface 50a is recessed may be arranged. In this manner, the metal block 50 is not limited to a substantially rectangular block body, and a block body having various forms may be employed as necessary.

Figure 5:
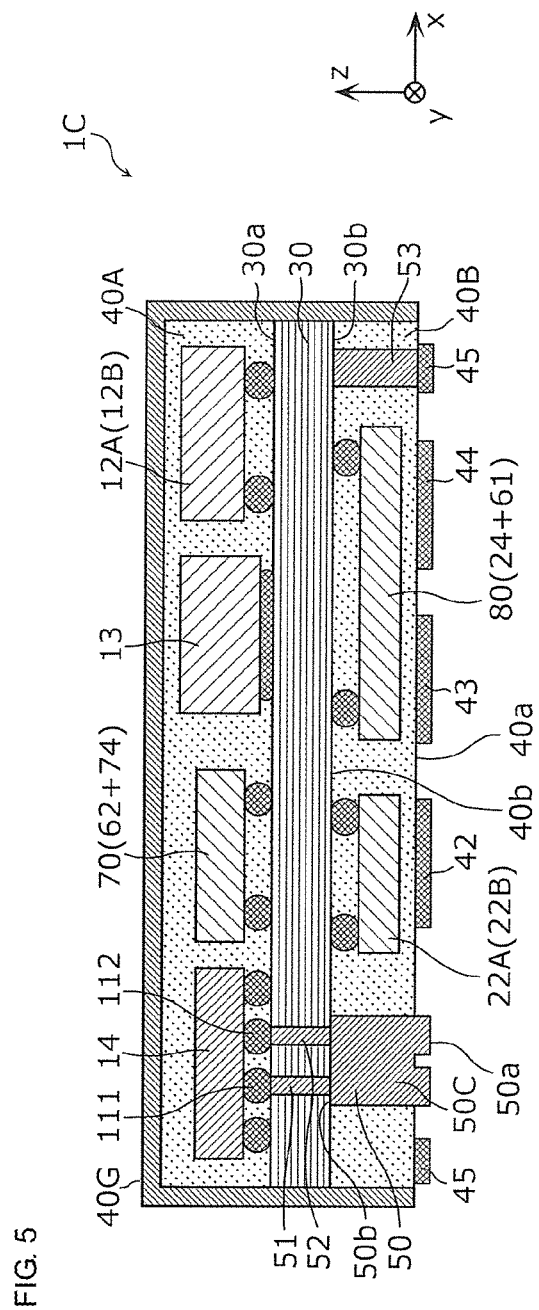
FIG. 5 is a cross-sectional configuration diagram of a high-frequency module according to a third modification of the first embodiment.

1-4. Configuration of High-Frequency Module 1C According to Third Modification FIG. 5 is a cross-sectional configuration diagram of a high-frequency module 1C according to a third modification of the first embodiment. As illustrated in the figure, the high-frequency module 1C includes the mounting substrate 30, the power amplifier 14, the semiconductor ICs 70 and 80, the matching circuit 13, the transmission filters 12A and 12B, the reception filters 22A and 22B, the resin members 40A and 40B, the via conductors 51 and 52, a metal block 50C, the columnar electrode 53, the connection terminals 41, 42, 43, 44, and 45, and the shield electrode layer 40G. As illustrated in FIG. 5, the power amplifier 14, the semiconductor IC 70, the matching circuit 13, the transmission filters 12A and 12B are mounted on the main surface 30a. Further, the metal block 50C, the reception filters 22A and 22B, and the semiconductor IC 80 are mounted on the main surface 30b.

The high-frequency module 1C according to this modification differs from the high-frequency module 1 according to the first embodiment in the configuration of the metal block 50C. Hereinafter, descriptions of the same points in the high-frequency module 1C according to this modification as the high-frequency module 1 according to the first embodiment will be omitted, and different points will be mainly described.

The metal block 50C has the main surface 50b (fifth main surface) bonded to the main surface 30b, the main surface 50a (sixth main surface) opposed to the main surface 50b, and the side surface connecting the main surface 50a and the main surface 50b.

The resin member 40B is arranged on the main surface 30b, and has a main surface 40b (seventh main surface) in contact with the main surface 30b, and a main surface 40a (eighth main surface) opposed to the main surface 40b, and is in contact with the side surface of the metal block 50C.

Here, at least a part of the main surface 50a of the metal block 50C protrudes from the main surface 40a of the resin member 40B. The external connection terminal (the connection terminal 41 in the high-frequency module 1 according to the first embodiment) to be connected to the external substrate is a portion protruding from the main surface 40a of the metal block 50C. That is, in this modification, the external connection terminal is not individually formed on a forefront surface in the z-axis negative direction of the metal block 50C, but the external connection terminal is defined as the forefront surface itself in the z-axis negative direction of the metal block 50C.

According to this configuration, since the portion of the metal block 50C protruding from the main surface 40a can be used as the external connection terminal, the process of forming the connection terminal can be simplified.

Figure 6:
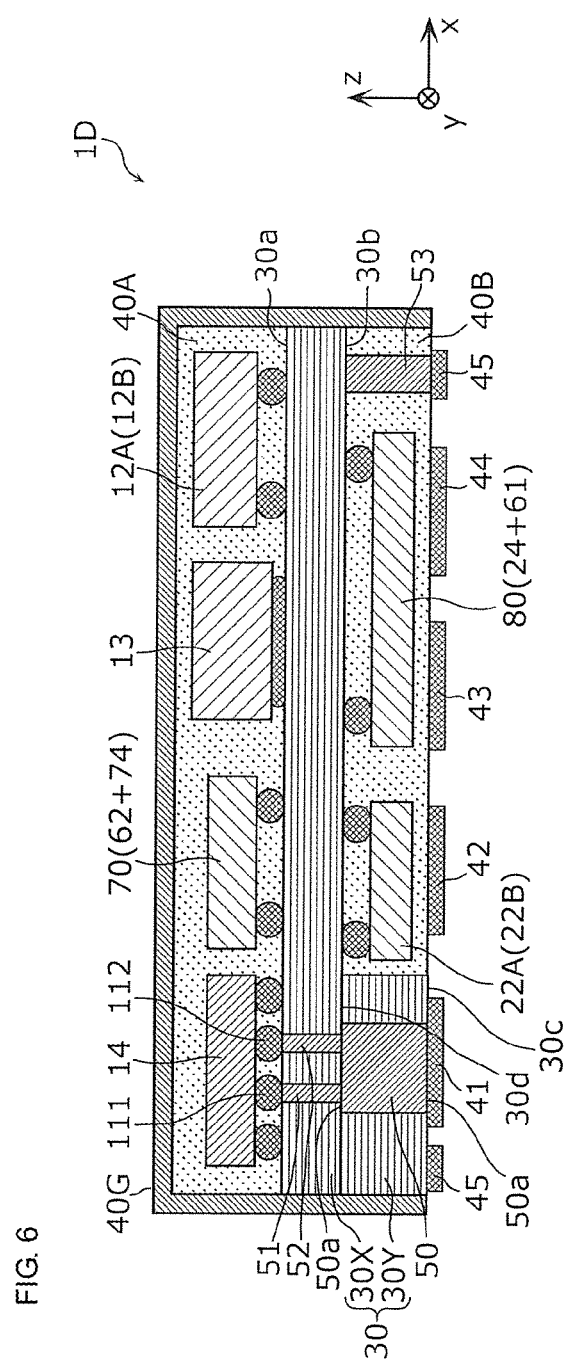
FIG. 6 is a cross-sectional configuration diagram of a high-frequency module according to a fourth modification of the first embodiment.

1-5. Configuration of High-Frequency Module 1D According to Fourth Modification FIG. 6 is a cross-sectional configuration diagram of a high-frequency module 1D according to a fourth modification of the first embodiment. As illustrated in the figure, the high-frequency module 1D includes the mounting substrate 30, the power amplifier 14, the semiconductor ICs 70 and 80, the matching circuit 13, the transmission filters 12A and 12B, the reception filters 22A and 22B, the resin members 40A and 40B, the via conductors 51 and 52, the metal block 50, the columnar electrode 53, the connection terminals 41, 42, 43, 44, and 45, and the shield electrode layer 40G. As illustrated in FIG. 6, the power amplifier 14, the semiconductor IC 70, the matching circuit 13, the transmission filters 12A and 12B are mounted on the main surface 30a. In addition, the reception filters 22A and 22B and the semiconductor IC 80 are mounted on the main surface 30b. Note that, in this modification, the metal block 50 is formed in a substrate portion 30Y which is a part of the mounting substrate 30.

The high-frequency module 1D according to this modification differs from the high-frequency module 1 according to the first embodiment in the arrangement of the metal block 50 and the configuration of the mounting substrate 30.

Hereinafter, descriptions of the same points in the high-frequency module 1D according to this modification as the high-frequency module 1 according to the first embodiment will be omitted, and different points will be mainly described.

The mounting substrate 30 includes a substrate portion 30X and the substrate portion 30Y. The substrate portion 30X has the main surface 30a and the main surface 30b opposed to each other, and is a double-sided mounting substrate on which circuit components are respectively mounted on the main surfaces 30a and 30b. The substrate portion 30X is a substrate made of a dielectric member or a multilayer substrate in which a plurality of dielectric layers is laminated, and examples thereof include a PCB substrate, a ceramic multilayer substrate, and the like. The substrate portion 30Y has a main surface 30c and a main surface 30d opposed to each other, and the main surface 30d is bonded to the main surface 30b, and is made of the same dielectric member as the dielectric member configuring the substrate portion 30X. The substrate portion 30X and the substrate portion 30Y may be formed integrally with each other.

The metal block 50 has the main surface 50b (fifth main surface) bonded to the main surface 30b, the main surface 50a (sixth main surface) opposed to the main surface 50b, and the side surface connecting the main surface 50a and the main surface 50b. Here, the side surface of the metal block 50 is covered with the substrate portion 30Y.

According to this configuration, since the side surface of the metal block 50 is covered with the dielectric material having a higher adhesion than the resin member 40B, it is possible to further suppress the metal block 50 from being detached from the mounting substrate 30. Therefore, the mechanical reliability of the high-frequency module 1D is improved.

Note that a dielectric constant of the substrate portion 30Y covering the side surface of the metal block 50 may be lower than a dielectric constant of the resin member 40B.

According to this configuration, an unnecessary signal that leaks to the circuit components mounted on the main surface 30b through the metal block 50 can be reduced.

Second Embodiment

In the high-frequency module 1 according to the first embodiment, a metal block is applied as a heat dissipation path, whereas in this embodiment, a high-frequency module to which a columnar electrode (Cu pillar) made of Cu is applied as a heat dissipation path is shown.

2-1. Configuration of High-Frequency Module 2 According to Second Embodiment

Figure 7:
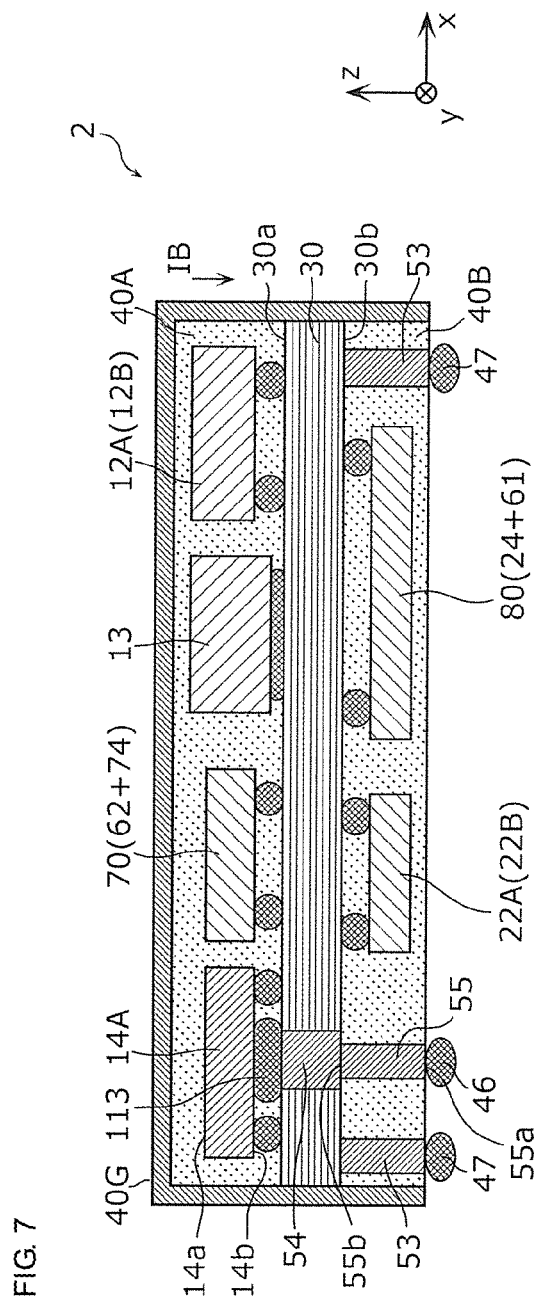
FIG. 7 is a cross-sectional configuration diagram of a high-frequency module according to a second embodiment.

FIG. 7 is a cross-sectional configuration diagram of a high-frequency module 2 according to a second embodiment. As illustrated in the figure, the high-frequency module 2 includes the mounting substrate 30, the power amplifier 14A, the semiconductor ICs 70 and 80, the matching circuit 13, the transmission filters 12A and 12B, the reception filters 22A and 22B, the resin members 40A and 40B, the long via conductor 54, the columnar electrode 53 and a columnar electrode 55, connection terminals 46 and 47, and the shield electrode layer 40G. The power amplifier 14A, the semiconductor IC 70, the matching circuit 13, and the transmission filters 12A and 12B are mounted on the main surface 30a. The columnar electrode 55, the reception filters 22A and 22B, and the semiconductor IC 80 are mounted on the main surface 30b.

The high-frequency module 2 according to the present embodiment is different from the high-frequency module 1A according to the first modification of the first embodiment in that the columnar electrode 55 is arranged instead of the metal block 50, and that the connection terminal is configured differently. Hereinafter, descriptions of the same points in the high-frequency module 2 according to this embodiment as the high-frequency module 1A according to the first modification of the first embodiment will be omitted, and different points will be mainly described below.

The power amplifier 14A is the first circuit component mounted on the main surface 30a, and is a transmission amplifier for amplifying the high-frequency transmission signal. The power amplifier 14A is formed on the main surface 14b and has long bump electrodes 113 having a substantially long shape when the mounting substrate 30 is viewed in a plan view. As illustrated in FIG. 2B, the long bump electrode 113 corresponds to, for example, an emitter terminal. In this embodiment, the long bump electrode 113 of the power amplifier 14A may not have a substantially long shape.

In the long via conductor 54, the end surface on the main surface 30a side is connected to the long bump electrode 113, and the end surface on the main surface 30b side is connected to the columnar electrode 55. Note that the long via conductor 54 connecting the power amplifier 14A and the columnar electrode 55 is not limited to one, and may be two or more.

The connection terminals 46 and 47 are arranged on the main surface 30b side with respect to the mounting substrate 30 and also on the surface of the resin member 40B on the z-axis negative direction side. The connection terminal 46 is an external connection terminal connected to the columnar electrode 55, and is connected to an external substrate arranged on the z-axis negative direction side of the high-frequency module 1. The connection terminal 47 is a ground terminal connected to the columnar electrode 53. The connection terminals 46 and 47 are, for example, solder ball electrodes. Note that the connection terminals 46 and 47 may be a planar conductor pattern formed on the surface of the resin member 40B on the z-axis negative direction side. In a case where the connection terminals 46 and 47 are solder ball electrodes, the process of applying the solder paste on the electrodes of the external substrate can be omitted in the mounting process of the high-frequency module 2 on the external substrate, so that the mounting process can be simplified.

Note that the connection terminal 46 may be a plating layer or the like formed on the forefront surface of the columnar electrode 55 in the z-axis negative direction.

The columnar electrode 55 is a columnar conductor made of Cu which is arranged on the main surface 30b side with respect to the mounting substrate 30 and which is connected to the long via conductor 54 and the connection terminal 46. More specifically, the columnar electrode 55 extends in a perpendicular direction (z-axis direction) of the main surface 30b, an end surface 55b (first end surface) is bonded to the long via conductor 54, and an end surface 55a (second end surface) opposed to the end surface 55b is bonded to the connection terminal 46.

Here, the power amplifier 14A overlaps the long via conductor 54, and the columnar electrode 55 overlaps the long via conductor 54.

According to this configuration, the columnar electrode 55 configuring the heat dissipation path of the power amplifier 14A is made of Cu having high conductivity. Further, since the long via conductor 54 overlaps the power amplifier 14A and the columnar electrode 55 in the plan view, the power amplifier 14A and the columnar electrode 55 can be connected by a wiring path in a direction (z-axis direction) perpendicular to the mounting substrate 30. That is, the power amplifier 14A and the columnar electrode 55 can be connected to each other by a substantially shortest path. Therefore, the heat generated in the power amplifier 14A can be dissipated by a heat dissipation path having high thermal conductivity, such as the long via conductor 54, the columnar electrode 55, and the connection terminal 46. For this reason, the heat generated in the power amplifier 14A can be efficiently dissipated from the connection terminal 46 to the outside while suppressing the transfer of the heat to the circuit components mounted on the main surface 30b. Therefore, it is possible to provide the high-frequency module 2 of the double-sided mounting type with improved heat dissipation performance and a communication apparatus including the high-frequency module 2.

The columnar electrode 55 may have a substantially long shape in the plan view, and the long via conductor 54 and the columnar electrode 55 may have longitudinal directions that coincide with each other in the plan view, and may be connected in a state of at least partially overlapping each other.

According to this configuration, it is possible to secure a large contact area between the columnar electrode 55 and the long via conductor 54. Therefore, the heat generated in the power amplifier 14A can be dissipated by a heat dissipation path having high thermal conductivity, such as the power amplifier 14A, the long via conductor 54, the long columnar electrode 55, and the connection terminal 46. Therefore, the heat dissipation performance of the power amplifier 14A can be enhanced.

Note that the side surface (connecting the end surface 55b and the end surface 55a) of the columnar electrode 55 may be covered with the same dielectric member as the dielectric member configuring the mounting substrate 30.

According to this configuration, since the side surface of the columnar electrode 55 is covered with a dielectric material having a higher adhesion than the resin member 40B, it is possible to suppress the columnar electrode 55 from being detached from the mounting substrate 30. Therefore, the mechanical reliability of the high-frequency module 2 is improved.

Further, a dielectric constant of the dielectric member covering the side surface of the columnar electrode 55 may be lower than a dielectric constant of the resin member 40B.

According to this configuration, an unnecessary signal that leaks to the circuit components mounted on the main surface 30b through the columnar electrode 55 can be reduced.

Note that, in the high-frequency module 2 according to the second embodiment, at least one of the semiconductor IC 80, the reception filters 22A and 22B may be mounted on the main surface 30b. Moreover, at least the power amplifier 14A may be mounted on the main surface 30a. In other words, in the high-frequency module 2 according to the second embodiment, the semiconductor ICs 70 and 80, the matching circuit 13, the transmission filters 12A and 12B, the reception filters 22A and 22B, the resin members 40A and 40B, the columnar electrode 53, the connection terminal 47, and the shield electrode layer 40G are not essential components.

Other Embodiments and the Like

While the high-frequency module and the communication apparatus according to the embodiment of the present disclosure have been described with reference to the first and second embodiments, the high-frequency module and the communication apparatus according to the present disclosure are not limited to the embodiments described above. Other embodiments that are realized by combining desired constituent elements in the above embodiments, modifications that are obtained by making various variations, on the above embodiments, conceived by those skilled in the art without departing from the spirit of the present disclosure, and various kinds of equipment incorporating the high-frequency module and the communication apparatus are also included in the present disclosure.

For example, in the high-frequency module and the communication apparatus according to the above embodiments, another circuit element, wiring or the like may be inserted between the circuit elements and the paths connecting the signal paths disclosed in the drawings.

The present disclosure is widely applicable to a communication device such as a mobile phone as a high-frequency module arranged in a front end unit used for multiple bands.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A high-frequency module comprising:
   a mounting substrate having a first main surface and a second main surface opposed to each other;
   a first circuit component mounted on the first main surface;
   a second circuit component mounted on the second main surface;
   an external connection terminal arranged on a second main surface side, the second main surface side being closer to the second main surface than to the first main surface with respect to the mounting substrate;
   a long via conductor connected to the first circuit component, passing through the mounting substrate, and having a substantially long shape when the mounting substrate is viewed in a plan view; and
   a metal block arranged on the second main surface side and connecting the long via conductor and the external connection terminal,
   wherein in the plan view, the first circuit component overlaps the long via conductor, and the metal block overlaps the long via conductor.

2. The high-frequency module according to claim 1, wherein the first circuit component includes:
   a third main surface opposed to the first main surface, and a fourth main surface opposed to the third main surface; and
   a long bump electrode provided on the third main surface and having a substantially long shape in the plan view; and
   the long bump electrode and the long via conductor have longitudinal directions coinciding with each other in the plan view, and are connected in a state of at least partially overlapping each other.

3. The high-frequency module according to claim 2, wherein the metal block has a substantially long shape in the plan view, and
   the metal block and the long via conductor have longitudinal directions coinciding with each other in the plan view, and are connected in a state of at least partially overlapping each other.

4. The high-frequency module according to claim 2,
wherein the metal block has a fifth main surface bonded to the second main surface, and a sixth main surface bonded to the external connection terminal, and
an area of the fifth main surface is smaller than an area of the sixth main surface.

5. The high-frequency module according to claim 1,
wherein the metal block has a fifth main surface bonded to the second main surface, and a sixth main surface bonded to the external connection terminal, and
an area of the fifth main surface is smaller than an area of the sixth main surface.

6. The high-frequency module according to claim 1,
wherein the metal block has a fifth main surface bonded to the second main surface, a sixth main surface opposed to the fifth main surface, and a side surface connecting the fifth main surface and the sixth main surface,
the high-frequency module further includes,
a resin member arranged on the second main surface and in contact with the side surface, and
a recess portion is provided on the side surface.

7. The high-frequency module according to claim 1,
wherein the metal block has a fifth main surface connected to a plurality of via conductors or a long via conductor provided on the mounting substrate, a sixth main surface opposed to the fifth main surface, and a side surface connecting the fifth main surface and the sixth main surface,
the high-frequency module further includes,
a resin member arranged on the second main surface side and covering at least a part of the second circuit component, and
the side surface is covered with a same dielectric member as a dielectric member configuring the mounting substrate.

8. The high-frequency module according to claim 7,
wherein a dielectric constant of the dielectric member covering the side surface is lower than a dielectric constant of the resin member.

9. The high-frequency module according to claim 1,
wherein the metal block has a fifth main surface bonded to the second main surface, a sixth main surface opposed to the fifth main surface, and a side surface connecting the fifth main surface and the sixth main surface,
the high-frequency module further includes,
a resin member arranged on the second main surface, having a seventh main surface in contact with the second main surface and an eighth main surface opposed to the seventh main surface, and being in contact with the side surface,
at least a part of the sixth main surface protrudes from the eighth main surface, and
the external connection terminal is a portion protruding from the eighth main surface of the metal block.

10. The high-frequency module according to claim 1,
wherein the first circuit component includes,
a third main surface opposed to the first main surface, and a fourth main surface opposed to the third main surface, and
a connection electrode provided on the third main surface,
the connection electrode is connected to a plurality of via conductors or a long via conductor provided in the mounting substrate, and
each of an area of the plurality of via conductors or the long via conductor in the plan view and an area of the metal block in the plan view is larger than an area of the connection electrode in the plan view.

11. The high-frequency module according to claim 1,
wherein the metal block is bonded to the second main surface using solder.

12. The high-frequency module according to claim 1,
wherein the external connection terminal is a solder ball electrode.

13. The high-frequency module according to claim 1,
wherein the first circuit component includes an amplifier for amplifying a high-frequency signal.

14. A communication apparatus comprising:
an RF signal processing circuit for processing a high-frequency signal transmitted and received by an antenna; and
the high-frequency module according to claim 1, wherein the high-frequency signal is transmitted between the antenna and the RF signal processing circuit.

15. A high-frequency module comprising:
a mounting substrate having a first main surface and a second main surface opposed to each other;
a first circuit component mounted on the first main surface;
a second circuit component mounted on the second main surface;
an external connection terminal arranged on a second main surface side, the second main surface side being closer to the second main surface than to the first main surface with respect to the mounting substrate;
a plurality of via conductors connected to the first circuit component and passing through the mounting substrate; and
a metal block arranged on the second main surface side and connecting the plurality of via conductors and the external connection terminal,
wherein when the mounting substrate is viewed in a plan view, the first circuit component overlaps the plurality of via conductors, and the metal block overlaps the plurality of via conductors.

16. The high-frequency module according to claim 15,
wherein the metal block has a fifth main surface bonded to the second main surface, and a sixth main surface bonded to the external connection terminal, and
an area of the fifth main surface is smaller than an area of the sixth main surface.

17. A high-frequency module comprising:
a mounting substrate having a first main surface and a second main surface opposed to each other;
a first circuit component mounted on the first main surface;
a second circuit component mounted on the second main surface;
an external connection terminal arranged on a second main surface side, the second main surface side being closer to the second main surface than to the first main surface with respect to the mounting substrate;
a via conductor connected to the first circuit component and passing through the mounting substrate; and
a columnar electrode comprising Cu, arranged on the second main surface side and connected to the via conductor and the external connection terminal,
wherein when the mounting substrate is viewed in a plan view, the first circuit component overlaps the via conductor, and the columnar electrode overlaps the via conductor,
wherein the via conductor has a substantially long shape in the plan view, the columnar electrode has a substantially long shape in the plan view, and the via conductor and the columnar electrode have longitudinal directions coinciding with each other in the plan view, and are connected in a state of at least partially overlapping each other.

18. The high-frequency module according to claim 17, wherein the columnar electrode has a first end surface connected to the via conductor, a second end surface opposed to the first end surface, and a side surface connecting the first end surface and the second end surface, the high-frequency module further includes, a resin member arranged on the second main surface side and covering at least a part of the second circuit component, and the side surface is covered with a same dielectric member as a dielectric member configuring the mounting substrate.

19. The high-frequency module according to claim 18, wherein a dielectric constant of the dielectric member covering the side surface is lower than a dielectric constant of the resin member.

* * * * *